(12) United States Patent
Uhlig et al.

(10) Patent No.: US 10,700,221 B2
(45) Date of Patent: Jun. 30, 2020

(54) MICROLENS HAVING A CARRIER-FREE OPTICAL INTERFERENCE FILTER

(71) Applicant: Infineon Technologies Dresden GmbH & Co. KG, Dresden (DE)

(72) Inventors: Ines Uhlig, Dresden (DE); Anjo Kirschner, Dresden (DE); Dirk Offenberg, Dresden (DE); Beatrice Poetschick, Dresden (DE); Bjoern Sausner, Dresden (DE); Thomas Schmitz-Huebsch, Dresden (DE); Mirko Vogt, Dresden (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 0 days.

(21) Appl. No.: 16/165,556

(22) Filed: Oct. 19, 2018

(65) Prior Publication Data

US 2019/0123217 A1  Apr. 25, 2019

(30) Foreign Application Priority Data

Oct. 20, 2017  (DE) .................. 10 2017 218 772

(51) Int. Cl.
| | |
|---|---|
| *H01L 27/146* | (2006.01) |
| *H01L 31/0216* | (2014.01) |
| *H01L 31/0232* | (2014.01) |
| *H01L 31/18* | (2006.01) |

(52) U.S. Cl.
CPC .... *H01L 31/02165* (2013.01); *H01L 27/1462* (2013.01); *H01L 27/14627* (2013.01); *H01L 27/14685* (2013.01); *H01L 31/02327* (2013.01); *H01L 31/18* (2013.01)

(58) Field of Classification Search
CPC ............... H01L 31/02165; H01L 31/18; H01L 31/02327; H01L 27/14627; H01L 27/1462; H01L 27/14685
See application file for complete search history.

(56) References Cited

U.S. PATENT DOCUMENTS

| | | | |
|---|---|---|---|
| 6,274,917 B1 * | 8/2001 | Fan ................... | H01L 27/14609 257/232 |
| 2002/0011638 A1 | 1/2002 | Bordogna et al. | |
| 2005/0035377 A1 * | 2/2005 | Kamimura ........ | H01L 27/14627 257/231 |
| 2005/0045927 A1 | 3/2005 | Li | |
| 2005/0087829 A1 * | 4/2005 | Merrill .............. | H01L 27/14603 257/440 |
| 2006/0033010 A1 * | 2/2006 | Jiang ................ | H01L 27/14627 250/208.1 |

(Continued)

*Primary Examiner* — Sitaramarao S Yechuri
(74) *Attorney, Agent, or Firm* — Murphy, Bilak & Homiller, PLLC

(57) ABSTRACT

An apparatus and a method for producing the apparatus are described, wherein the apparatus includes a substrate with a photodetector and a dielectric arranged on the substrate. Further, the apparatus includes a microlens arranged on a first side of the dielectric. The microlens is configured to steer incident radiation onto the photodetector. Moreover, the apparatus includes a carrier-free optical interference filter. The microlens is arranged between the photodetector and the interference filter, and the interference filter has a plane surface on a side facing away from the photodetector.

21 Claims, 8 Drawing Sheets

(56) References Cited

U.S. PATENT DOCUMENTS

| | | | |
|---|---|---|---|
| 2006/0267123 A1* | 11/2006 | Wu ................... | H01L 27/14627 257/432 |
| 2008/0087921 A1* | 4/2008 | Yu ..................... | H01L 27/14627 257/213 |
| 2012/0132809 A1* | 5/2012 | Findlay ................ | G01J 1/0209 250/353 |
| 2014/0035012 A1* | 2/2014 | Wang ................ | H01L 27/14618 257/292 |
| 2016/0161332 A1* | 6/2016 | Townsend .............. | G02B 5/201 250/208.2 |
| 2018/0067245 A1* | 3/2018 | Giachino ............... | G02B 5/281 |
| 2018/0267220 A1* | 9/2018 | Frey ...................... | G02B 5/286 |

* cited by examiner

```
┌─────────────────────────────────┐
│ Providing a substrate with a photodetector,│
│ a dielectric that is arranged on the substrate│
│ and a microlens that is arranged on a first│
│ side of the dielectric facing away from the │──21
│ substrate, wherein the microlens is embodied to│
│ steer incident radiation onto the photodetector│
└─────────────────────────────────┘
                │
                ▼
┌─────────────────────────────────┐
│ Providing a carrier-free optical interface filter│
│ which has, at least on a first side facing away │──22
│ from the photodetector, a plane surface │
└─────────────────────────────────┘
                │
                ▼
┌─────────────────────────────────┐
│ Arranging the optical interference filter in│
│ such a way that the microlens is arranged│
│ between the photodetector and the │──23
│ interference filter │
└─────────────────────────────────┘
```

Fig. 2

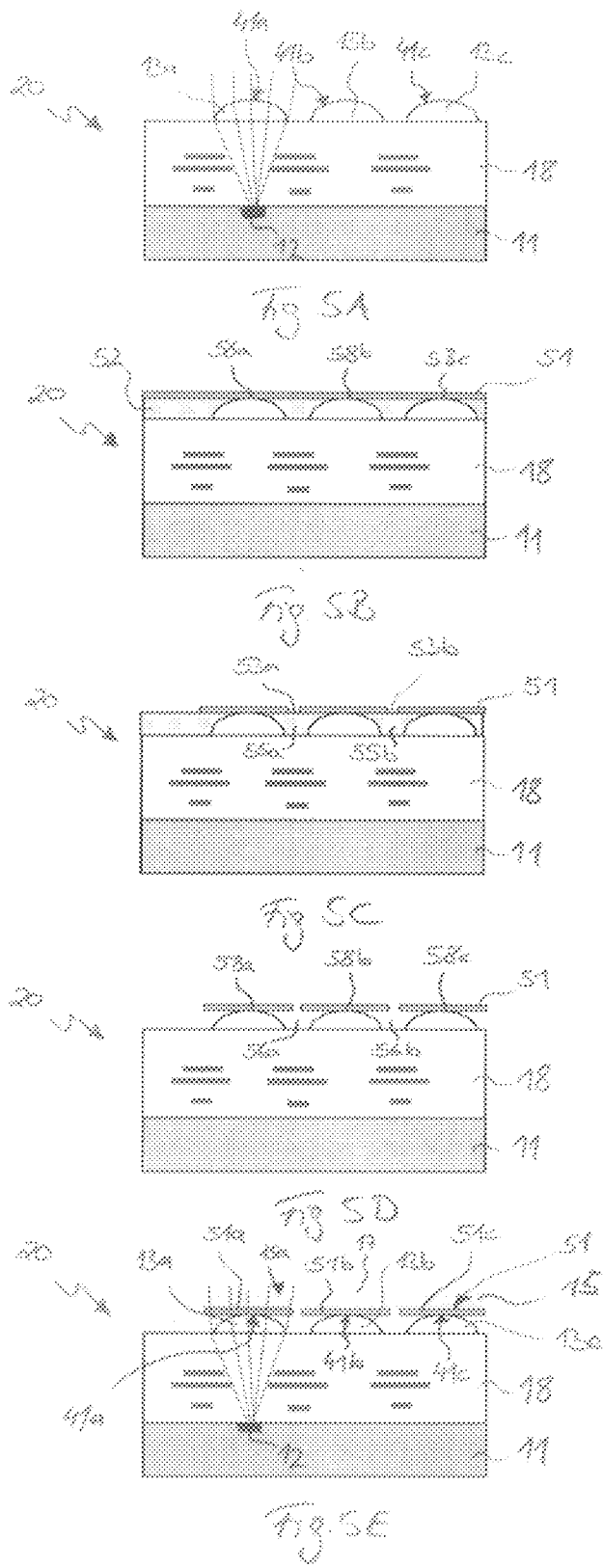

MICROLENS HAVING A CARRIER-FREE OPTICAL INTERFERENCE FILTER

TECHNICAL FIELD

The present disclosure relates to an apparatus having a microlens and a carrier-free optical interference filter, and to a method for producing such an apparatus, as well as, in particular, an integration of optical on-chip interference filters for optical sensors with microlenses.

BACKGROUND

Previously, interference filters were produced externally on individual carriers, such as separate glass plates, for example, and installed in an optical system above optical sensors and microlenses. However, integrating the separate external carriers into the optical system is difficult and time-consuming and, moreover, connected with high costs.

Therefore, it would be desirable to provide improved apparatuses and methods for producing such apparatuses, which are able to be integrated in a simple and cost-effective manner.

SUMMARY

According to an embodiment of an apparatus, the apparatus comprises: a substrate with a photodetector and a dielectric that is arranged on the substrate; a microlens arranged on a first side of the dielectric facing away from the substrate and configured to steer incident radiation onto the photodetector; and a carrier-free optical interference filter, wherein the microlens is arranged between the photodetector and the interference filter, wherein the interference filter has a plane surface on a side facing away from the dielectric.

According to an embodiment of a method, the method comprises: providing a substrate with a photodetector, a dielectric arranged on the substrate and a microlens arranged on a first side of the dielectric facing away from the substrate, the microlens being configured to steer incident radiation onto the photodetector; providing a carrier-free optical interference filter which has, at least on a first side facing away from the photodetector, a plane surface; and arranging the optical interference filter such that the microlens is arranged between the photodetector and the interference filter.

Those skilled in the art will recognize additional features and advantages upon reading the following detailed description, and upon viewing the accompanying drawings.

BRIEF DESCRIPTION OF THE DRAWINGS

Exemplary embodiments are illustrated in the drawing and explained below. In detail:

FIG. 2 shows a block diagram for an exemplary embodiment of a method according to the present disclosure, FIG. 5A shows a side view of an exemplary embodiment of an apparatus with microlenses with an arched microlens surface, FIG. 5B shows a side view of the apparatus of FIG. 5A with an additional material layer and a filter support structure arranged thereon before an interference filter was applied, FIG. 5C shows a side view of the apparatus of FIG. 5B after structuring the filter support structure, FIG. 5D shows a side view of the apparatus of FIG. 5C after the additional material layer under the filter support structure was removed, FIG. 5E shows a side view of the apparatus of FIG. 5D after an interference filter was applied.

DETAILED DESCRIPTION

Preferred exemplary embodiments are described in more detail below with reference to the figures, wherein elements with the same or similar function are provided with the same reference sign.

The expressions plane, planar and level can be used synonymously in the following description.

The following FIGS. 1A to 7B serve to describe exemplary embodiments of an apparatus 10, 20 and the concrete description of exemplary embodiments of a method for producing such an apparatus 10, 20.

Figure 1A:
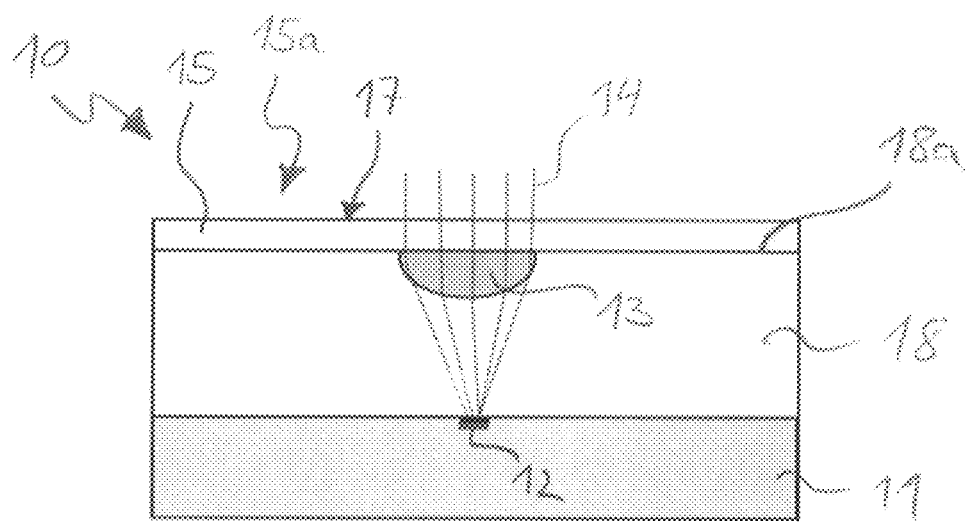
FIG. 1A shows a side view of an exemplary embodiment of an apparatus according to the present disclosure.
Figure 1B:
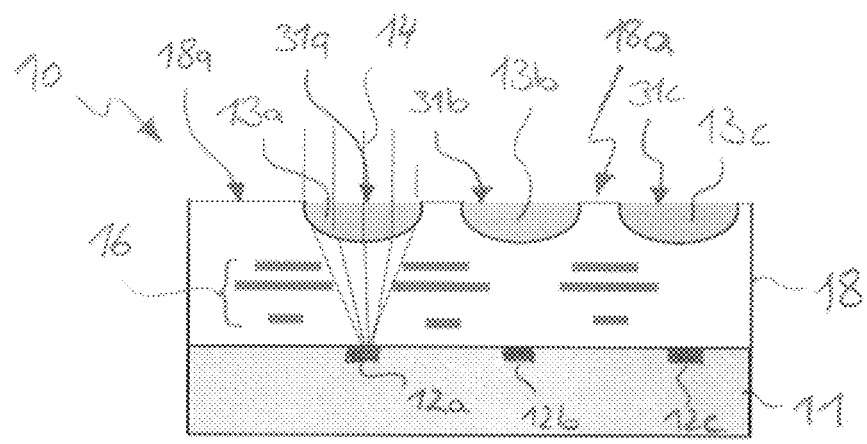
FIG. 1B shows a side view of an exemplary embodiment of an apparatus before an interference filter was attached.
Figure 1C:
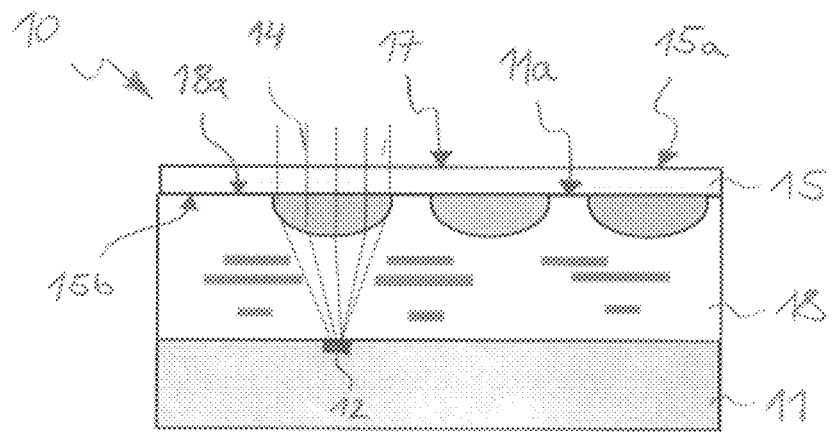
FIG. 1C shows a side view of the exemplary embodiment of the apparatus of FIG. 1A after an interference filter was attached.

FIGS. 1A, 1B and 1C show a first exemplary embodiment of an apparatus 10 and a concrete exemplary embodiment of a production method according to the present disclosure in exemplary fashion.

It is clear from FIG. 1A that the apparatus 10 comprises a substrate 11 with a photodetector 12. Further, the apparatus comprises a dielectric 18 that is arranged on the substrate 11.

The dielectric 18 has a first side 18a facing away from the substrate 11. A microlens 13 is arranged on this first side 18a of the dielectric 18. The microlens 13 is configured to steer incident radiation 14 onto the photodetector 12.

Further, the apparatus 10 comprises an optical interference filter 15. The optical interference filter 15 is arranged at the apparatus 10 in such a way that the microlens 13 is arranged between the photodetector 12 and the optical interference filter 15.

Moreover, the optical interference filter 15 has a plane surface 17 on a side 15a facing away from the dielectric 18.

FIG. 1B shows a further exemplary embodiment, with three microlenses 13a, 13b, 13c being illustrated here in an exemplary manner. It is understood that the apparatus 10 may also comprise two microlenses, or else more than the illustrated three microlenses.

In the exemplary embodiment illustrated here, the apparatus 10 thus once again comprises a substrate 11. Here, the substrate 11 likewise comprises three photodetectors 12a, 12b, 12c, corresponding to the number of microlenses 13a, 13b, 13c. The photodetectors 12a, 12b, 12c are configured to detect incident radiation 14. To this end, the photodetectors 12a, 12b, 12c may have at least one photosensitive layer, for example, it being possible for said photosensitive layer to be arranged in or at the substrate 11. By way of example, the photodetectors 12a, 12b, 12c can be embodied as a photogate, a photodiode, a photo- or image sensor and the like.

Further, the apparatus 10 comprises a dielectric 18, which is arranged on the substrate 11. The previously mentioned three microlenses 13a, 13b, 13c are arranged on a first side 18a of the dielectric 18 facing away from the substrate 11.

In the exemplary embodiments described below, the apparatus 10, 20 is described, purely in exemplary fashion, with three microlenses 13a, 13b, 13c. At least one microlens 13 is provided; however, more or fewer microlenses 13a, 13b, 13c may also be provided. Two or more microlenses may also be provided in the form of a microlens array.

The microlenses 13a, 13b, 13c are configured to steer incident radiation 14 (e.g., light) onto the photodetectors 12a, 12b, 12c, with a single photosensor 12 being illustrated in the subsequent figures in purely exemplary fashion. The microlenses 13a, 13b, 13c can be produced using microprocess technology and can have a mean diameter from approximately 0.5 µm to approximately 50 µm, or from approximately 5 µm to approximately 30 µm, or, alternatively, from approximately 10 µm to approximately 20 µm.

By way of example, one or more of the microlenses 13a, 13b, 13c can be produced using a reflow method. As an alternative or in addition thereto, one or more microlenses 13a, 13b, 13c can be printed onto the dielectric 18 by means of a printer that is suitable to this end.

As illustrated in FIG. 1B, the apparatus 10 further comprises an optical interference filter 15. The optical interference filter 15 is configured to filter certain wavelength ranges or a certain wavelength spectrum out of the incident radiation 14, such as incident electromagnetic radiation (e.g., light), for example. Therefore, the optical interference filter 15 should be distinguished from a polarization filter. A polarization filter filters out radiation components with a certain polarization direction.

The interference filter 15 has a first side 15a and a second side 15b arranged opposite thereto. The first side 15a of the interference filter 15 faces away from the substrate 11 and/or the photodetector 12 and/or the dielectric 18 and/or the microlenses 13a, 13b, 13c. The second side 15b of the interference filter 15 faces the substrate 11 and/or the photodetector 12 and/or the dielectric 18 and/or the microlenses 13a, 13b, 13c.

Expressed differently, the microlenses 13a, 13b, 13c are arranged between the interference filter 15 and the photodetector 12 or between the interference filter 15 and the photodetector 12, with a dielectric 18 arranged therebetween, in this case.

The interference filter 15 is characterized, inter alia, by two properties. First of all, the interference filter 15 is carrier-free; i.e., the interference filter 15 does not comprise a separate external carrier, on which the interference filter 15 is arranged. Instead, the interference filter 15 can be arranged directly at the microlenses 13a, 13b, 13c. Alternatively, an integrated support structure can be provided between the interference filter 15 and the microlenses 13a, 13b, 13c, as described later with reference to FIGS. 5A to 6B. Secondly, the interference filter 15 is embodied as a plane interference filter; i.e., the optical interference filter 15 has a plane surface 17, at least on a side 15a facing away from the photodetector 12.

According to an exemplary embodiment, this plane surface 17 of the interference filter 15 can be moreover arranged parallel to the first side 18a of the dielectric 18. The incident radiation 14 with the resultant transmission spectrum can then be focused onto the corresponding photodetector 12a, 12b, 12c by the microlenses 13a, 13b, 13c lying therebelow. Each deviation of the angle of incidence of the radiation 14 on the filter surface is accompanied by changes in the path differences of individual filter layers. Arched filter surfaces, in particular, lead to a greater variation in the angle of incidence of the radiation 14 on the filter surface. Deviating, unsharp transmission spectra are the consequence. This renders clear why it is advantageous to arrange the interference filter 15 in planar fashion above the microlenses 13a, 13b, 13c over the photodetectors 12a, 12b, 12c.

In the exemplary embodiment illustrated here, the second side 15b of the interference filter 15 that is arranged opposite the first side 15a can also be arranged parallel to the first side 18a of the dielectric 18 and can likewise have a plane surface, which further strengthens the above-described positive effects.

By way of example, the optical interference filter 15 can be embodied as a layer which may be arranged on or at the dielectric 18 and/or the microlenses 13a, 13b, 13c. This layer, in turn, may consist of one or more individual plies.

By way of example, the interference filter 15 can be deposited using a deposition method, for example using a CVD (chemical vapor deposition) process, an ALD (atom layer deposition) process, a PVD (physical vapor deposition) process and the like. Firstly, gas components can be supplied to the sputtering process or, secondly, different oxide targets can be used.

By way of example, two different materials can be deposited in alternating fashion in the process. As an alternative or in addition thereto, individual successive layers can be deposited with different layer thicknesses. Thus, for example, a layer structure with alternate layers made of silicon oxide and amorphous silicon would be conceivable, said layers optionally being able to have different layer thicknesses. By way of example, the interference filter 15 can have a sequence of five to fifty layers. Here, the overall thickness of the interference filter 15 could be approximately 1 µm to approximately 15 µm.

The exemplary embodiments illustrated in FIGS. 1A, 1B and 1C, and all exemplary embodiments of the apparatus 10, 20 described below, can be integrated on chip, preferably at the wafer level. By way of example, the apparatus 10, 20 can be manufactured using CMOS technology. This is indicated in FIG. 1B (and in subsequent figures) in exemplary fashion in the form of metal structure layers 16 within the dielectric 18.

A method for producing an apparatus 10, 20 is explained below with reference to FIG. 2. To this end, FIG. 2 shows a block diagram with individual method steps, which, incidentally, can also be implemented in a sequence that differs from the one illustrated here.

In block 21, a substrate 11 with a photodetector 12, a dielectric 18 arranged on the substrate 11 and a microlens 13 arranged on a first side 18a of the dielectric 18 facing away from the substrate 11 are provided, wherein the microlens 13 is configured to steer incident radiation 14 onto the photodetector 12.

In block 22, a carrier-free optical interference filter 15 is provided, said carrier-free optical interference filter having a plane surface 17, at least on a first side 15a facing away from the photodetector 12.

In block 23, the optical interference filter 15 is arranged in such a way that the microlens 13 is arranged between the photodetector 12 and the interference filter 15.

Optionally, the method may include further steps, which are intended to be described in more detail with renewed reference to FIGS. 1B and 1C. In the process, for example, at least one of the microlenses 13a, 13b, 13c can be structured into the first side 18a of the dielectric 18. By way of example, this structuring can be implemented using dry-chemical or wet-chemical etching methods, using lithography techniques such as, e.g., photolithography, grayscale lithography or electron beam lithography, or using mechanical methods, such as, e.g. milling, boring and the like. Using this, a cavity may be structured into the dielectric 18, for example. The cavity may have the desired form of the subsequent microlens 13a, 13b, 13c.

Moreover, the cavity can be subsequently filled with a suitable lens material. By way of example, a suitable lens material would be a material having a higher refractive index than the material of the surroundings and/or of the dielectric 18. Furthermore, it is recommended that the suitable lens material is transmissive to the incident radiation 14.

According to this exemplary embodiment, the first side 18a of the dielectric 18 and the microlenses 13a, 13b, 13c that are structured into the dielectric 18 can be planarized in order to consequently produce a plane surface of at least the microlenses 13a, 13b, 13c. Thus, after planarization, the microlenses 13a, 13b, 13c have a plane microlens surface 31a, 31b, 31c on a side facing away from the photodetector 12 and the first side 18a of the dielectric 18 can likewise have a plane surface on account of the planarization. The plane microlens surfaces 31a, 31b, 31c and the plane surface 18a of the dielectric 18 can be coplanar in this case, i.e., they can be situated in the same plane.

The above-described interference filter 15 can be arranged on the plane surface of at least the microlenses 13a, 13b, 13c, i.e., at least on one of the microlens surfaces 31a, 31b, 31c. In the exemplary embodiment illustrated here, the interference filter 15 is arranged both on the plane microlens surfaces 31a, 31b, 31c and on the plane surface 18a of the dielectric 18, and so the interference filter 15 is in direct contact with the microlenses 13a, 13b, 13c and the dielectric 18.

The exemplary embodiment of the apparatus 10 illustrated in FIGS. 1B and 1C therefore comprises microlenses 13a, 13b, 13c, which are structured into the first side 18a of the dielectric 18. Here, the microlenses 13a, 13b, 13c each have a plane microlens surface 31a, 31b, 31c on a side facing away from the photodetector 12, said plane microlens surface being coplanar with the first side 18a of the dielectric 18. Here, the interference filter 15 is in direct contact with at least one of the plane microlens surfaces 31a, 31b, 31c.

Figure 3A:
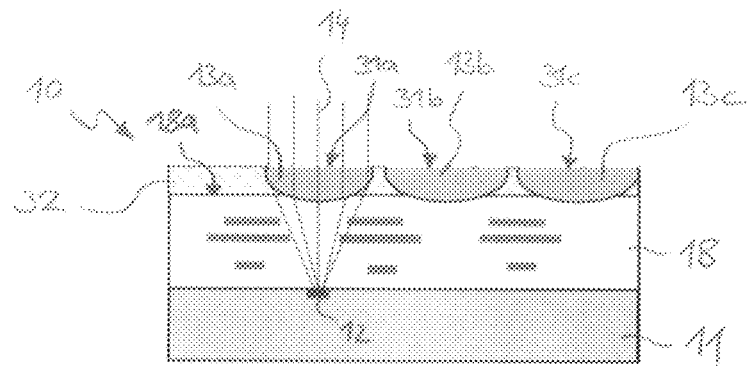
FIG. 3A shows a side view of an exemplary embodiment of an apparatus with an additional material layer before an interference filter was attached.
Figure 3B:
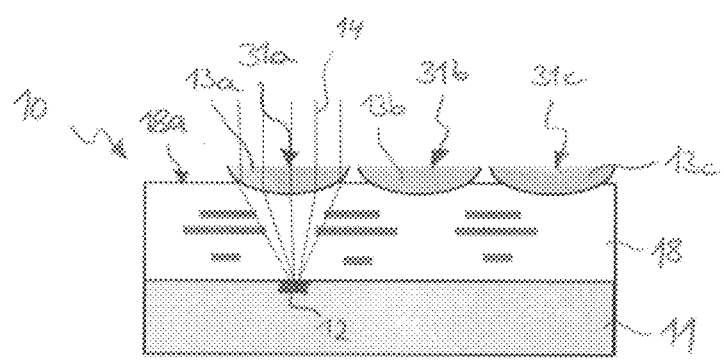
FIG. 3B shows a side view of the apparatus of FIG. 3A after the additional material layer was removed and before an interference filter was applied.
Figure 3C:
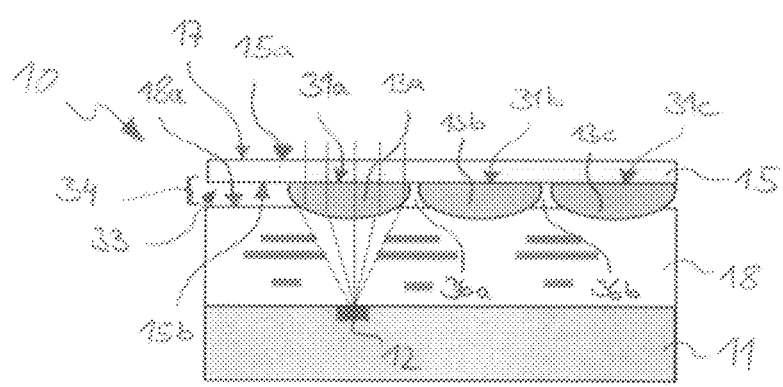
FIG. 3C shows a side view of the apparatus of FIG. 3B after an interference filter was applied.

FIGS. 3A, 3B and 3C show a second exemplary embodiment of an apparatus 10 and a concrete elucidation of the method for producing this apparatus 10.

The microlenses 13a, 13b, 13c each likewise have a plane microlens surface 31a, 31b, 31c in this second exemplary embodiment of the apparatus 10. However, as shown in FIG. 3B, these plane microlens surfaces 31a, 31b, 31c are spaced apart from the first side 18a of the dielectric 18 in the vertical direction; i.e., the plane microlens surfaces 31a, 31b, 31c and the optionally plane surface 18a of the dielectric 18 are not coplanar in this case.

An interference filter 15 is arranged on the plane microlens surfaces 31a, 31b, 31c in the second exemplary embodiment, too, as illustrated in FIG. 3C. Moreover, the interference filter 15 likewise has a plane surface 17 on its first side 15a, which faces away from the photodetector 12, in this case, too.

At least portions of the second side 15b of the interference filter 15, facing the photodetector 12, can be in contact with the first side 18a of the dielectric 18, although this is not illustrated in more detail here. Alternatively, as indicated by reference sign 34 in FIG. 3C, the second side 15b of the interference filter 15 can be spaced apart from the first side 18a of the dielectric 18. Moreover, it is conceivable for first portions of the second side 15b of the interference filter 15 to be in contact with the first side 18a of the dielectric 18, while second portions of the second side 15b of the interference filter 15 are spaced apart from the first side 18a of the dielectric 18. This is shown in the exemplary embodiment illustrated in FIG. 5E, said exemplary embodiment being explained in more detail below.

A gap 33 arises between the interference filter 15 and the dielectric 18 on account of the spacing 34 between the second side 15b of the interference filter 15 and the first side 18a of the dielectric 18, as illustrated in FIG. 3C. Since, moreover, the microlenses 13a, 13b, 13c can be arranged at a distance from one another on the dielectric 18, a cavity 36a, 36b moreover arises between adjacent microlenses 13a, 13b, 13c. However, such a cavity 36a, 36b may also arise on account of the convex form of the microlenses 13a, 13b, 13c, even if the microlenses 13a, 13b, 13c are arranged adjacent to one another, i.e., not spaced apart from one another.

A medium or a material that has a lower refractive index than at least one of the microlenses 13a, 13b, 13c and/or the dielectric 18 can be situated in the gap 33 or in the cavities 36a, 36b. The material or medium situated in the gap 33 can be a material that is transmissive to the radiation 14. The medium situated in the gap 33 or in the cavities 36a, 36b can be air with a refractive index of 1.00, for example.

By way of example, the material or medium situated in the gap 33 or in the cavities 36a, 36b can have a refractive index $n_0$, the dielectric 18 can have a refractive index $n_1$ and the interference filter 15 can have a refractive index $n_2$, where $n_2 > n_1 > n_0$. As a result, the incident radiation 14 can be focused in the direction of the photodetector 12.

The production method of the apparatus 10 according to the second exemplary embodiment should be described in more detail below, with reference being made again to FIGS. 3A, 3B and 3C.

Thus, FIG. 3A shows the apparatus 10, wherein an additional material layer 32, which can serve as a sacrificial layer, is arranged on the first side 18a of the dielectric 18. At least one of the microlenses 13a, 13b, 13c can be structured into this additional material layer 32, in a manner similar to what was described above with reference to FIGS. 1B and 1C.

A side of the microlenses 13a, 13b, 13c facing away from the photodetector 12 can be planarized in order to obtain a plane microlens surface 31a, 31b, 31c. The additional material layer 32, too, can be planarized together with the microlenses 13a, 13b, 13c such that a plane surface arises at the additional material layer 32, said plane surface once again being able to be coplanar with the plane microlens surfaces 31a, 31b, 31c. Subsequently, the interference filter 15 can be arranged directly on the plane microlens surface 31a, 31b, 31c of at least one of the microlenses 13a, 13b, 13c, to be precise while maintaining the additional material layer 32. Here, the interference filter 15 may optionally also contact the plane surface of the material layer 32.

However, as an alternative thereto, as shown in FIG. 3B, the additional material layer 32 can be removed again, at least in part, and preferably in full, after structuring the microlenses 13a, 13b, 13c. Therefore, the additional material layer 32 may also be referred to as a sacrificial layer in this case. The sacrificial layer 32 can be removed before or after arranging the interference filter 15 on the plane microlens surfaces 31a, 31b, 31c. In both cases, the apparatus 10 illustrated in FIG. 3C arises as a result.

As is possible to identify here, the previously mentioned gap 33 or the cavities 36a, 36b arise between the first side 18a of the dielectric 18 and the interference filter 15 during the step of removing the sacrificial layer 32.

According to this exemplary embodiment of the method, at least portions of the gap 33 or the cavities 36a, 36b can be filled with a material that has a lower refractive index than the microlenses 13a, 13b, 13c and/or the dielectric 18. However, it is also possible not to fill the gap 33 or the cavities 36a, 36b, and so air remains as a medium in the gap 33 or in the cavities 36a, 36b. It is also conceivable for a vacuum to be provided in the gap 33 or in the cavities 36a, 36b, requiring a corresponding tightness of the gap 33 or of the cavities 36a, 36b in relation to the dielectric 18 and the interference filter 15.

What is common to both the first exemplary embodiment (FIGS. 1A, 1B, 1C) and the second exemplary embodiment (FIGS. 3A to 3C) of the apparatus 10 is that the microlenses 13a, 13b, 13c have a plane microlens surface 31a, 31b, 31c, which faces away from the first side 18a of the dielectric 18. Moreover, the interference filter 15 is in direct contact with at least these plane microlens surfaces 31a, 31b, 31c in both exemplary embodiments. Moreover, at least the plane surface 17 of the interference filter 15 is arranged parallel to the first side 18a of the dielectric 18 in both exemplary embodiments. Moreover, the sides of the microlenses 13a, 13b, 13c facing the photodetector 12 may have arching in order to deflect the incident radiation 14. This arching can be concave or convex arching that is typical for lenses.

Further conceivable exemplary embodiments provide microlenses 13a, 13b, 13c that have a converse alignment. That is to say, the microlenses 13a, 13b, 13c have arching facing away from the first side 18a of the dielectric 18. Here, the present disclosure provides exemplary embodiments of production methods that allow a plane interference filter 15 to be arranged at these arched microlens surfaces.

An exemplary embodiment of such an apparatus 20 and exemplary embodiments of a method for producing such an apparatus 20 are intended to be described in more detail below with reference to FIGS. 4A to 4C.

Figure 4A:
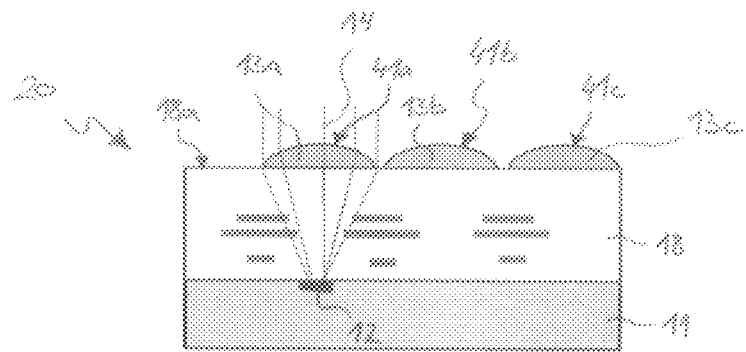
FIG. 4A shows a side view of an exemplary embodiment of an apparatus with microlenses with an arched microlens surface.

Thus, for example, FIG. 4A shows an apparatus 20, which substantially corresponds to the apparatus 10 described previously with reference to FIGS. 1A and 1B but differs in that the microlenses 13a, 13b, 13c are arranged the other way round in this case. That is to say, the microlenses 13a, 13b, 13c have an arched microlens surface 41a, 41b, 41c on their respective side facing away from the photodetector 12. Here, the microlenses 13a, 13b, 13c can be arranged at or on the dielectric 18 and, in particular, at or on the first side 18a of the dielectric 18.

Figure 4B:
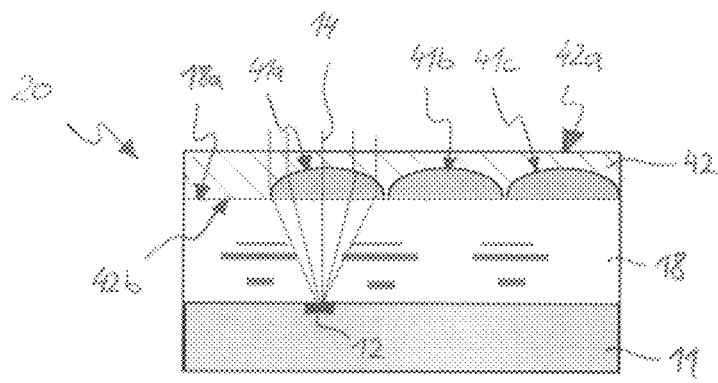
FIG. 4B shows a side view of the apparatus of FIG. 4A with an additional material layer before an interference filter was applied.

FIG. 4B shows that a coating 42 is arranged on the first side 18a of the dielectric 18. This coating 42 covers the arched microlens surfaces 41a, 41b, 41c at least in part and preferably in full. In the exemplary embodiment illustrated in FIGS. 4B and 4C, the coating 42 covers the arched microlens surfaces 41a, 41b, 41c in full.

The coating 42 has a first side 42a, which faces away from the dielectric 18 and the microlens surfaces 41a, 41b, 41c. Moreover, as illustrated, the first side 42a of the coating 42 can face away from the first side 18a of the dielectric 18 and/or the photodetector 12. As illustrated, the first side 42a of the coating 42 can be spaced apart from the microlens surfaces 41a, 41b, 41c in the vertical direction. However, alternatively, it would also be conceivable for the first side 42a of the coating 42 to be thinned back to a vertex of the arched microlens surfaces 41a, 41b, 41c.

Further, the coating 42 has a second side 42b lying opposite the first side 42a, said second side being in contact with the dielectric 18 and, in particular, with the first side 18a of the dielectric 18.

Figure 4C:
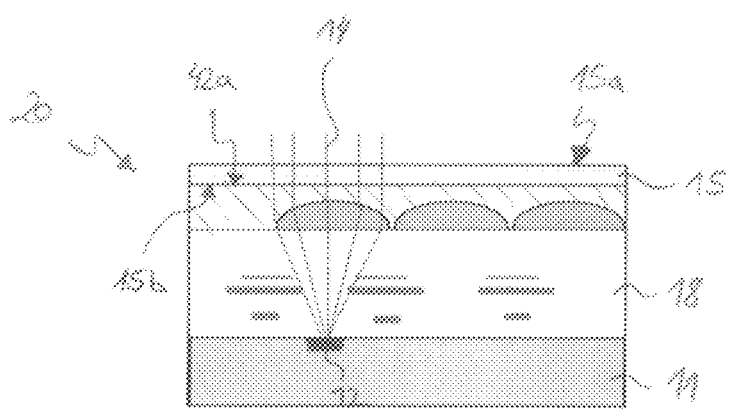
FIG. 4C shows a side view of the apparatus of FIG. 4B after an interference filter was applied with the additional material layer being maintained.

As shown in FIG. 4C, the apparatus 20 comprises an optical interference filter 15. The optical interference filter 15 has a first side 15a, which faces away from the dielectric 18 and/or the photodetector 12 and/or the microlenses 13a, 13b, 13c. Further, the optical interference filter 15 has a second side 15b lying opposite the first side 15a, said second side facing the dielectric 18 and/or the photodetector 12 and/or the microlenses 13a, 13b, 13c.

The second side 15b of the optical interference filter 15 is in contact with the first side 42a of the coating 42, and so the optical interference filter 15 is arranged at the coating 42.

FIGS. 4B and 4C show individual method steps for producing a just-described apparatus 20. As can be identified from FIG. 4B, the method includes applying a material layer 42 to the first side 18a of the dielectric 18 and to the microlenses 13a, 13b, 13c, and so the microlenses 13a, 13b, 13c are covered by this material layer 42. As mentioned at the outset, the microlenses 13a, 13b, 13c may be covered completely by the material layer 42, for example. As an alternative thereto, the material layer 42 may only reach up to a portion, e.g., a vertex, of the arched microlens surfaces 41a, 41b, 41c, which can be achieved by thinning back the material layer 42, for example.

This material layer 42 can be planarized in a further method step. More precisely, the side 42a of the material layer 42 facing away from the dielectric 18 can be planarized. Here, the method step of planarizing can be implemented in such a way that the microlenses 13a, 13b, 13c continue to be covered by the material layer 42, even after planarizing. The microlenses 13a, 13b, 13c are consequently enclosed in the material layer 42.

As shown in FIG. 4C, the interference filter 15 can be arranged on the planarized material layer 42 in a further method step. Here, the interference filter 15 can be arranged on the planarized side 42a of the material layer 42 facing away from the dielectric 18.

The material layer 42 is preferably transmissive to the radiation 14 to the greatest possible extent. By way of example, the material layer 42 can be an oxide layer. In all embodiments, the microlenses 13a, 13b, 13c can comprise polysilicon or nitride, for example. Moreover, the microlenses 13a, 13b, 13c may have a greater refractive index than the material layer 42 and/or the dielectric 18 in all embodiments. By way of example, the material layer 42 and the dielectric 18 can have the same refractive index.

Incidentally, the apparatus 20 described with reference to FIGS. 4A to 4C and the associated production method can also be implemented should the microlenses 13a, 13b, 13c be embodied as described above with reference to FIGS. 1A to 1C and 3A to 3C, i.e., should the microlenses 13a, 13b, 13c have a plane microlens surface 31a, 31b, 31c instead of an arched microlens surface 41a, 41b, 41c on the side facing away from the photodetector 12.

A further exemplary embodiment of the apparatus 20 and of a method for producing such an apparatus 20 is shown in FIGS. 5A to 5E. Initially, reference is intended to be made to the apparatus 20 to be obtained by means of the production method, as illustrated in FIG. 5E.

FIG. 5E shows an apparatus 20, which comprises a substrate 11 with a photodetector 12 and a dielectric 18, and one or more microlenses 13a, 13b, 13c, wherein the microlenses 13a, 13b, 13c each have an arched microlens surface 41a, 41b, 41c on a side lying opposite the photodetector 12.

The exemplary embodiment illustrated in FIGS. 5A to 5E is substantially similar to the exemplary embodiment described above with reference to FIGS. 4A to 4C. However, a difference consists in the fact that a filter support structure 51 is additionally provided in the exemplary embodiment shown in FIGS. 5A to 5E.

As may be identified in FIG. 5E in particular, this filter support structure 51 is arranged between the microlenses 13a, 13b, 13c and the interference filter 15. Here, the filter support structure 51 is arranged on the arched microlens surfaces 41a, 41b, 41c. More specifically, the filter support structure 51 is in contact with the arched microlens surfaces 41a, 41b, 41c with a first side facing the dielectric 18 and the filter support structure 51 is in contact with the interference filter 15 with a second side facing away from the dielectric 18.

The filter support structure 51 can have an integral embodiment. However, the filter support structure 51 can also have a multipart embodiment, wherein, for example, a first part 51a of the filter support structure 51 can be in contact with a first microlens 13a, a second part 51b of the filter support structure 51 can be in contact with a second microlens 13b and a third part 51c of the filter support structure 51 can be in contact with a third microlens 13c.

The filter support structure 51 can be integrated with the optical apparatus 10, 20 on chip, e.g., at a wafer level. Consequently, it differs from known optical apparatuses, in which interference filters are arranged on external or non-integrated carriers, such as external glass carriers, for example, wherein the external carrier, together with the interference filter applied thereon, needs to be connected to the remaining optical apparatus with much outlay.

As mentioned previously, the filter support structure 51 has a first side, which faces the dielectric 18 or the microlenses 13a, 13b, 13c. Moreover, the filter support structure 51 has a second side lying opposite said first side, said second side facing away from the dielectric 18 or the microlenses 13a, 13b, 13c.

At least on the second side facing away from the dielectric 18, the filter support structure 51 can have a plane surface. Then, the interference filter 15 can be arranged on this plane surface in turn. The filter support structure 51 can have a flat embodiment. Moreover, the filter support structure 51, or at least the first side of the filter support structure 51 facing away from the dielectric 18, can be arranged parallel to the first side 18a or the surface of the dielectric 18. That is to say, the first side of the filter support structure 51 is planar in order to simplify arranging a plane interference filter 15 thereon.

The filter support structure 51 substantially serves to be able to arrange the interference filter 15 to be as level as possible on the arched microlens surfaces 41a, 41b, 41c. It is possible to cover the arched microlens surfaces 41a, 41b, 41c by means of the filter support structure 51 such that a level surface arises, the latter making it easier to arrange the interference filter 15 thereon, particularly if the interference filter 15, as mentioned at the outset, should be deposited onto the microlenses 13a, 13b, 13c in one or more layers or plies by means of a deposition method.

Reference should now be made initially to FIG. 5A in respect of the production of the just-described apparatus 20 with a filter support structure 51.

FIG. 5A shows the substrate 11 with the photodetector 12, the dielectric 18 arranged on the substrate 11 and the one or more microlenses 13a, 13b, 13c, wherein the microlenses 13a, 13b, 13c have an arched microlens surface 41a, 41b, 41c on their side facing away from the dielectric 18 or the photodetector 12.

In this exemplary embodiment, and in all other exemplary embodiments, the microlenses 13a, 13b, 13c can be spaced apart from one another. By way of example, in each case, the microlenses 13a, 13b, 13c can be spaced apart from one another by approximately 500 nm or more.

FIG. 5B shows how an additional material layer 52, which can also be referred to as a sacrificial layer, is arranged on the dielectric 18. By way of example, this additional material layer 52 can be arranged on the first side 18a of the dielectric 18 and, in the process, can cover at least portions of the microlenses 13a, 13b, 13c and can preferably cover the microlenses all over. On its side facing away from the dielectric 18, the material layer 52 can be planarized in order to obtain a plane material layer surface.

Moreover, the material layer 52 can be thinned back to the microlenses 13a, 13b, 13c in this case. Preferably, the microlenses 13a, 13b, 13c each have at least one portion 58a, 58b, 58c, which is not covered by the material layer 52 or which is at least exposed again by thinning back. By way of example, this is a portion 58a, 58b, 58c on the arched microlens surface 41a, 41b, 41c. The filter support structure 51 can be subsequently arranged and contacted with, or affixed to, the microlenses 13a, 13b, 13c on these uncovered or exposed portions 58a, 58b, 58c.

By way of example, to this end, the filter support structure 51 can be initially arranged on the plane material layer surface of the material layer 52. Here, the filter support structure 51 can already contact the just-mentioned exposed portions 58a, 58b, 58c of the microlenses 13a, 13b, 13c, as shown in exemplary fashion in FIG. 5B.

By way of example, the filter support structure 51 can be deposited on the planarized material layer surface by applying deposition methods. Mechanically, the filter support structure 51 has a predominantly rigid property; i.e., the filter support structure 51 can be embodied in such a way that it is self-supporting and predominantly rigid. The filter support structure 51 can comprise an oxide, for example silicon dioxide.

In an embodiment, the interference filter 15 now can be arranged directly on the filter support structure 51, to be precise while maintaining the material layer 52.

In an alternative configuration, the material layer 52 can be removed, which is why the material layer 52 can also be referred to as a sacrificial layer or as a sacrificial material in this case.

By way of example, to this end, the filter support structure 51 can be structured, as shown in FIG. 5C, and so local apertures 53*a*, 53*b* are produced in the filter support structure 51. As mentioned at the outset, the microlenses 13*a*, 13*b*, 13*c* can be spaced apart from one another. Consequently, interstices 55*a*, 55*b* are formed between the microlenses 13*a*, 13*b*, 13*c*. Preferably, the local apertures 53*a*, 53*b* can be structured into the filter support structure 51 in the region of these interstices 55*a*, 55*b*, for example thereabove.

As shown in FIG. 5D, the sacrificial material 52 can be removed through these local apertures 53*a*, 53*b*. To this end, use can be made of a dry- or wet-chemical etching method, for example. Consequently, the sacrificial material 52 is removed selectively in relation to the surrounding structures, in particular selectively in relation to the microlenses 13*a*, 13*b*, 13*c*. In the process, cavities 56*a*, 56*b* are formed between the microlenses 13*a*, 13*b*, 13*c* and the filter support structure 51.

These cavities 56*a*, 56*b* can be filled with a material that has a lower refractive index than the microlenses 13*a*, 13*b*, 13*c*. By way of example, air with a refractive index of 1.00 can be present in the cavities 56*a*, 56*b*, with the microlenses 13*a*, 13*b*, 13*c* then having a refractive index greater than 1.00.

After the removal of the sacrificial material 52, the filter support structure 51 remains on the arched microlens surfaces 41*a*, 41*b*, 41*c*, more precisely at least on the above-described portions 58*a*, 58*b*, 58*c* of the microlenses 13*a*, 13*b*, 13*c*, which were previously not covered by the sacrificial material 52. Provided the filter support structure 51 has a rigid structure, as mentioned above, the filter support structure 51 forms a support structure for the interference filter 15 to be applied thereon.

As shown in FIG. 5E, the interference filter 15 is arranged on the filter support structure 51, for example by applying a deposition process. Here, for process-related reasons, a part of the interference filter 15 can also be arranged on the first side 18*a* of the dielectric 18, which can be seen to the left in the image of FIG. 5E. However, according to the present disclosure, the interference filter 15 has a plane surface 17, at least on its side 15*a* facing away from the dielectric 18 and/or the photodetector 12.

The just-described filter support structure 51 therefore serves to arrange the interference filter 15 thereon, for example by means of a deposition process. However, this should be distinguished from conventional interference filters, mentioned at the outset, in which a separate carrier is produced therewith and in which the interference filter has to be arranged at the apparatus together with this separate carrier. As a rule, these carriers are relatively cumbersome and comparatively bulky so that they can even be sensibly handled. Restrictions in the miniaturization of the camera are the consequence. By contrast, in the present apparatus 10, 20, the filter support structure 51 can be applied substantially more delicately, directly onto the dielectric 18 and consequently be integrated into the apparatus 10, 20. It is also possible to install pixels with filters and pixels without filters in a product, these having different properties. Different sensor types (e.g., an additional integration of brightness sensors) are possible in a pixel array. Furthermore, this also cuts production costs since the filter support structure 51 can be integrated on the dielectric 18 on chip during the running production method. By contrast, the separate carriers need to be initially produced independently in the case of conventional apparatuses.

Incidentally, the filter support structure 51 described with reference to FIGS. 5C to 5E can also be used in embodiments of the above-described apparatus 10, i.e., in embodiments in which the microlenses 13*a*, 13*b*, 13*c* have a plane microlens surface 31*a*, 31*b*, 31*c* (see FIGS. 1A to 1C and 3A to 3C) instead of the arched microlens surface 41*a*, 41*b*, 41*c*, illustrated here, on their side facing away from the photodetector 12.

Figure 6A:
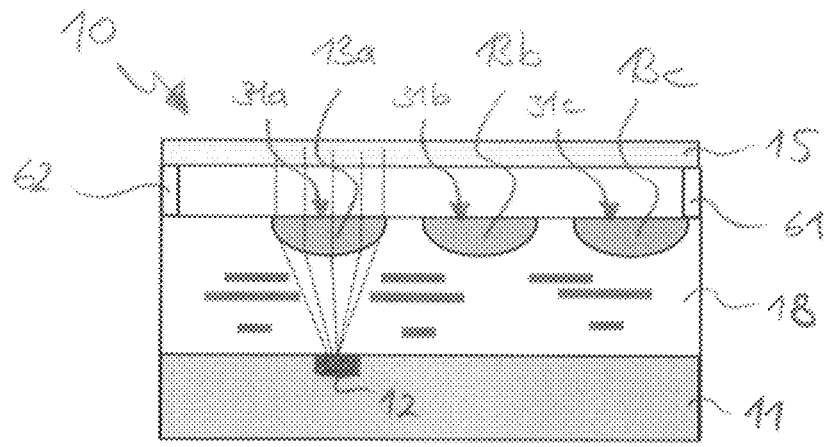
FIG. 6A shows a side view of an apparatus with microlenses with a plane microlens surface and a self-supporting filter support structure.
Figure 6B:
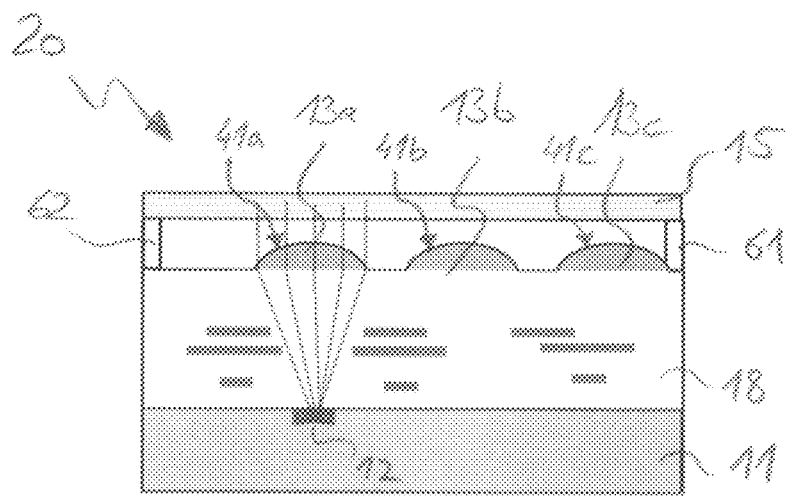
FIG. 6B shows a side view of an apparatus with microlenses with an arched microlens surface and a self-supporting filter support structure.

FIGS. 6A and 6B show further exemplary embodiments. These exemplary embodiments substantially differ from the exemplary embodiments described above in that the interference filter 15 is arranged at a different configuration of a filter support structure 61, 62.

The filter support structure imaged in FIGS. 6A and 6B can be embodied in the form of one or more columns 61, 62 or supporting pillars or posts, for example.

FIG. 6A shows an exemplary embodiment of an apparatus 10 with microlenses 13*a*, 13*b*, 13*c*, which have a plane microlens surface 31*a*, 31*b*, 31*c*. FIG. 6B shows an embodiment of an apparatus 20 with microlenses 13*a*, 13*b*, 13*c*, which have an arched microlens surface 41*a*, 41*b*, 41*c*.

While the filter support structure 51, described above with reference to FIGS. 5C to 5E, was supported on the microlens surface 41*a*, 41*b*, 41*c* and/or a material layer 32, 42, 52, the filter support structure 61, 62 shown here in FIGS. 6A and 6B is embodied as a self-supporting filter support structure. That is to say, the interference filter 15 is suspended in self-supporting fashion at the filter support structure 61, 62.

Just like the filter support structure 51 described above with reference to FIGS. 5A to 5E, the filter support structure 61, 62 can be integrated on chip, e.g. at a wafer level. Therefore, it likewise differs from known apparatuses in which interference filters are arranged on external or non-integrated carriers, such as on external glass carriers, for example, wherein the external carrier together with the interference filter applied thereon needs to be connected to the optical apparatus with much outlay.

The filter support structure 61, 62 can be embodied in such a way that the interference filter 15 suspended therefrom in self-supporting fashion is spaced apart from the microlens surface. As an alternative thereto, however, the filter support structure 61, 62 can also be embodied in such a way that the interference filter 15 suspended therefrom in self-supporting fashion is in contact with the microlens surface.

What is common to all previously described exemplary embodiments is that the interference filter 15 is arranged relative to the microlenses 13*a*, 13*b*, 13*c* in such a way that the radiation 14 initially passes through the interference filter 15 and subsequently passes through the microlenses 13*a*, 13*b*, 13*c*.

As an alternative thereto, it is also conceivable for the interference filter 15 to be arranged relative to the microlenses 13*a*, 13*b*, 13*c* in such a way that the radiation 14 initially passes through the microlenses 13*a*, 13*b*, 13*c* and only subsequently passes through the interference filter 15.

Figure 7A:
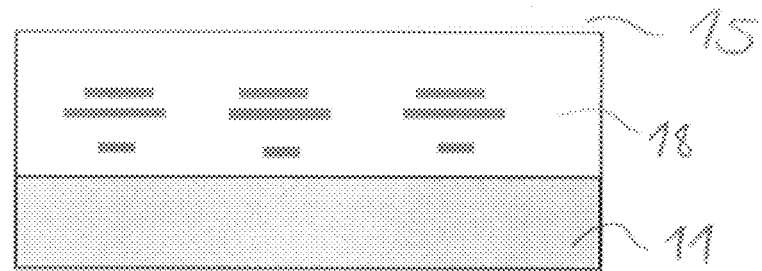
FIG. 7A shows a side view of a conceivable alternative apparatus with an interference filter before microlenses were arranged.

As shown in FIG. 7A, the interference filter 15 can be arranged directly on the first side 18*a* of the dielectric 18, for example, which can be implemented by means of a deposition method, for example.

Figure 7B:
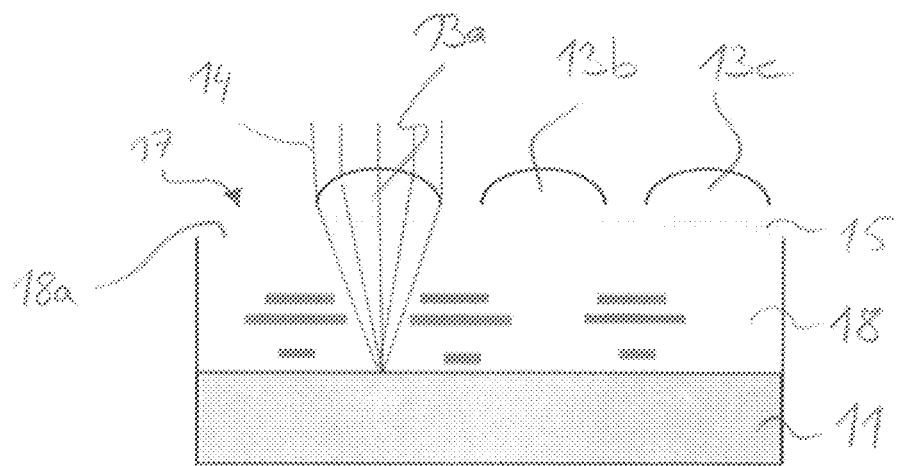
FIG. 7B shows a side view of the apparatus of FIG. 7A with microlenses arranged thereon.

Then, as shown in FIG. 7B, the microlenses 13*a*, 13*b*, 13*c* can be arranged on the plane surface 17 of the interference filter 15. Consequently, the radiation 14 passes first through the microlenses 13*a*, 13*b*, 13*c* and only subsequently through the interference filter 15.

However, it is advantageous if the wavelength ranges are filtered first by means of the interference filter 15 before the bandwidth-filtered radiation then strikes the microlenses 13*a*, 13*b*, 13*c*.

Apart therefrom, the interference filter 15 can have a flat embodiment in all exemplary embodiments. That is to say, the interference filter 15 can be embodied as a component that is level or plane on both sides.

Being able to integrate microlenses 13a, 13b, 13c and optical on-chip interference filters 15 together on optical semiconductor sensors, in particular in CMOS technology, is facilitated by the exemplary embodiments described herein. Technological solutions allowing one or more interference filters 15 to be arranged in planar fashion above and below microlenses 13a, 13b, 13c as an on-chip variant are illustrated.

Such an on-chip variant for interference filters 15 significantly reduces the filter and assembly costs. To this end, different integration approaches are listed in this disclosure. By way of example, a simple method would be that of initially depositing the interference filter 15 in planar fashion and thereafter constructing the microlenses 13a, 13b, 13c.

However, the filter performance may be impaired if there is additional oblique incidence of light on account of the light focusing by means of the microlenses 13a, 13b, 13c. Therefore, it is advantageous if the incident light 14 is initially filtered to a desired wavelength by means of the interference filter 15 and thereafter focused onto the photodetector 12 (e.g., photogates) by means of the microlenses 13a, 13b, 13c.

By way of example, positioning the interference filter 15 over or on the microlenses 13a, 13b, 13c allows the functions thereof, i.e., light focusing by means of the microlenses 13a, 13b, 13c and blocking unwanted wavelength ranges by means of the interference filter 15, to be combined well and not to be lost or adversely affected. As a result, it is possible, for example, to reduce oblique light incidence on the interference filter 15, which is also unwanted, on account of the lens effect.

In summary, the exemplary embodiments described herein therefore allow, inter alia, planar positioning of an interference filter 15 below and/or above one or more microlenses 13a, 13b, 13c. Consequently, an aspect of the present disclosure thus comprises the combination, arrangement and formation of an integrated optical interference filter 15 above and/or below one or more microlenses 13a, 13b, 13c.

Below, the above-described exemplary embodiments should be summarized again briefly below in other words, with reference to the figures:

a) Exemplary Embodiment 1: Interference Filter 15 Over "Bowl-Like" Microlenses 13

FIG. 1B: forming the microlenses 13a, 13b, 13c as "bowls", which are filled with more refractive (optically denser) material and planarized FIG. 1C: depositing the interference filter 15 b) Exemplary Embodiment 2: Interference Filter 15 Over "Bowl-Like" Microlenses 13 and Cavities 33, 36a, 36b FIG. 3A: depositing a sacrificial layer 32 and forming the microlenses 13a, 13b, 13c as "bowls" within this sacrificial layer 32, said lenses being filled with more refractive material and planarized FIG. 3B: removing the sacrificial layer 32 (selectively in relation to the surrounding material) and creating cavities 33, 36a, 36b FIG. 3C: depositing the interference filter 15 c) Exemplary Embodiment 3: Interference Filter 15 Over "Arched" Microlenses 13a, 13b, 13c while Maintaining the Additional Material Layer 42

FIG. 4A: forming the microlenses 13a, 13b, 13c from optically denser material

FIG. 4B: filling the lens interstices with an optically thinner material and planarizing FIG. 4C: depositing the interference filter 15 d) Exemplary Embodiment 4: Interference Filter 15 Over "Arched" Microlenses 13a, 13b, 13c FIG. 5B: planarizing the microlens surface topology by means of a sacrificial material 52 and depositing a filter base layer as a filter support structure 51

FIG. 5C: structuring and producing local apertures 53a, 53b in the filter support structure 51

FIG. 5D: removing the sacrificial material 52 (selectively in relation to the surrounding material) and creating cavities 56a, 56b between the microlenses 13a, 13b, 13c and the filter support structure 51

FIG. 5E: depositing the interference filter 15 e) Exemplary Embodiment 5: Self-Supporting Interference Filter 15 Over Microlenses 13a, 13b, 13c FIG. 6A: self-supporting interference filter 15 over "bowl-like" microlenses FIG. 6B: self-supporting interference filter 15 over "arched" microlenses f) Exemplary Embodiment 6: Filter Below the Microlenses FIG. 7A: depositing the interference filter 15

FIG. 7B: forming the microlenses 13a, 13b, 13c above the interference filter 15

Additional or alternative exemplary embodiments of the present disclosure can be embodied as follows:

According to a first aspect, an apparatus can comprise the following features: a substrate with a photodetector and a dielectric that is arranged on the substrate, a microlens that is arranged on a first side of the dielectric facing away from the substrate and that is configured to steer incident radiation onto the photodetector, and a carrier-free optical interference filter, wherein the microlens is arranged between the photodetector and the interference filter and the interference filter has a plane surface on a side facing away from the dielectric.

According to a second aspect with reference to the first aspect, at least the plane surface of the interference filter can be arranged parallel to the first side of the dielectric.

According to a third aspect with reference to the first aspect, the microlens can have a plane microlens surface on a side facing away from the photodetector, and the interference filter can be in direct contact with at least this plane microlens surface.

According to a fourth aspect with reference to the third aspect, the microlens can be structured into the first side of the dielectric and the plane microlens surface can be coplanar with the first side of the dielectric, wherein the interference filter can be in direct contact with both the plane microlens surface and the first side of the dielectric.

According to a fifth aspect with reference to the third aspect, the plane microlens surface can be spaced apart from the first side of the dielectric, wherein at least portions of the interference filter can be spaced apart from the first side of the dielectric.

According to a sixth aspect with reference to the fifth aspect, a gap can be situated between the first side of the dielectric and the interference filter, a medium or a material having a lower refractive index than the microlens and/or the dielectric being situated in said gap.

According to a seventh aspect with reference to the first aspect, the microlens can have an arched microlens surface on a side facing away from the photodetector, and a filter support structure can be arranged between the microlens and the interference filter, wherein the filter support structure can be in contact with the arched microlens surface on a first side and with the interference filter on an opposite second side.

According to an eighth aspect with reference to the seventh aspect, at least the second side of the filter support structure can be arranged parallel to the first side of the dielectric, wherein the interference filter can be arranged on the second side of the filter support structure.

According to a ninth aspect with reference to the seventh aspect, the apparatus can have a cavity between the filter support structure and the first side of the dielectric, a medium or a material having a lower refractive index than the microlens and/or the dielectric being situated in said cavity.

According to a tenth aspect with reference to the first aspect, a self-supporting filter support structure can be arranged on the first side of the dielectric and the interference filter can be arranged in self-supporting fashion at this filter support structure, wherein the interference filter can be spaced apart from the first side of the dielectric and/or from the microlens by means of the filter support structure.

According to an eleventh aspect with reference to the first aspect, the apparatus can further comprise a coating that is arranged on the first side of the dielectric and that covers the microlens, wherein the interference filter can be arranged on a side of the coating facing away from the dielectric.

According to a twelfth aspect with reference to the first aspect, the interference filter can have a flat embodiment.

According to a thirteenth aspect with reference to the first aspect, the interference filter can be an interference filter with at least five layers, which has been applied by means of a deposition process.

According to a fourteenth aspect with reference to the first aspect, the microlens can have a mean diameter from 0.5 μm to 50 μm or from 5 μm to 30 μm or from 10 μm to 20 μm.

According to a fifteenth aspect, a method can include the following steps: providing a substrate with a photodetector, a dielectric that is arranged on the substrate and a microlens that is arranged on a first side of the dielectric facing away from the substrate, wherein the microlens is configured to steer incident radiation onto the photodetector, providing a carrier-free optical interference filter which has, at least on a first side facing away from the photodetector, a plane surface and arranging the optical interference filter in such a way that the microlens is arranged between the photodetector and the interference filter.

According to a sixteenth aspect with reference to the fifteenth aspect, the method can include: structuring the microlens into the first side of the dielectric, planarizing the first side of the dielectric and the microlens in order to produce a plane surface of at least the microlens, and arranging the interference filter on the plane surface such that the interference filter is in direct contact with the microlens and the dielectric.

According to a seventeenth aspect with reference to the fifteenth aspect, the method can include: applying a material layer to the first side of the dielectric and structuring the microlens in this material layer, planarizing a side of the microlens facing away from the dielectric in order to produce a plane microlens surface, and arranging the interference filter on the plane microlens surface while maintaining the material layer.

According to an eighteenth aspect with reference to the fifteenth aspect, the method can include: applying a sacrificial layer to the first side of the dielectric and structuring the microlens in this sacrificial layer, planarizing a side of the microlens facing away from the dielectric in order to produce a plane microlens surface, arranging the interference filter on the plane microlens surface, and at least partly removing the sacrificial layer.

According to a nineteenth aspect with reference to the eighteenth aspect, a cavity can arise between the first side of the dielectric and the interference filter in the step of removing the sacrificial layer, wherein this cavity is able to be filled with a medium or a material that has a lower refractive index than the microlens and/or the dielectric.

According to a twentieth aspect with reference to the fifteenth aspect, the method can include: applying a material layer to the first side of the dielectric and to the microlens such that the microlens is covered by this material layer, planarizing the material layer, wherein the microlens remains covered with this material layer, and arranging the interference filter on the planarized material layer.

According to a twenty-first aspect with reference to the fifteenth aspect, the method can include: applying a material layer to the first side of the dielectric and to at least a part of the microlens, planarizing the material layer in order to produce a plane material layer surface, arranging a filter support structure on the material layer surface, and arranging the interference filter on the filter support structure while maintaining the material layer.

According to a twenty-second aspect with reference to the fifteenth aspect, the method can include: applying a sacrificial layer to the first side of the dielectric and to at least a part of the microlens, planarizing the sacrificial layer in order to produce a plane sacrificial layer surface, wherein the microlens has a portion that is not covered by the sacrificial layer, arranging a filter support structure on the sacrificial layer surface and the uncovered portion of the microlens, arranging the interference filter on the filter support structure, and at least partly removing the sacrificial layer.

According to a twenty-third aspect with reference to the fifteenth aspect, providing and arranging the interference filter can be implemented under the application of a chemical vapor deposition.

According to a twenty-fourth aspect with reference to the twenty-third aspect, the interference filter can be deposited in a sequence of five to fifty layers.

Although some aspects have been described in association with an apparatus, it goes without saying that these aspects also constitute a description of the corresponding method, and so a block or a component of an apparatus should also be understood as a corresponding method step or as a feature of a method step. Analogously thereto, aspects that have been described in association with or as a method step also constitute a description of a corresponding block or detail or feature of a corresponding apparatus.

The exemplary embodiments described above constitute merely an illustration of the principles of the claimed apparatus and of the claimed method. It goes without saying that modifications and variations of the arrangements and details described herein will become apparent to others skilled in the art. Therefore, the intention is for the present disclosure to be restricted only by the scope of protection of the following patent claims rather than by the specific details presented herein on the basis of the description and the explanation of the exemplary embodiments.

What is claimed is:

1. A method, comprising:
   providing a substrate with a photodetector, a dielectric arranged on the substrate and a microlens arranged on a first side of the dielectric facing away from the substrate, the microlens being configured to steer incident radiation onto the photodetector;
   providing a carrier-free optical interference filter which has, at least on a first side facing away from the photodetector, a plane surface;
   arranging the optical interference filter such that the microlens is arranged between the photodetector and the interference filter;
   applying a sacrificial layer to the first side of the dielectric;
   structuring the microlens in the sacrificial layer;
   planarizing a side of the microlens facing away from the photodetector to produce a plane microlens surface;
   arranging the interference filter on the plane microlens surface; and
   at least partly removing the sacrificial layer,
   wherein a cavity is formed between the first side of the dielectric and the interference filter during the at least partly removing the sacrificial layer,
   wherein the cavity is fillable with a medium or a material that has a lower refractive index than the microlens and/or the dielectric.

2. The method of claim 1, wherein providing and arranging the interference filter is implemented under application of a chemical vapor deposition.

3. The method of claim 2, wherein the interference filter is deposited in a sequence of five to fifty layers.

4. The method of claim 1, wherein at least the plane surface of the interference filter is arranged parallel to the first side of the dielectric.

5. The method of claim 1, wherein the interference filter is in direct contact with at least the plane of the microlens surface.

6. The method of claim 1, further comprising:
   applying a coating that covers the microlens,
   wherein the interference filter is arranged on a side of the coating facing away from the dielectric.

7. The method of claim 1, wherein the microlens has a mean diameter in a range of 0.5 µm to 50 µm.

8. A method, comprising:
   providing a substrate with a photodetector, a dielectric arranged on the substrate and a microlens arranged on a first side of the dielectric facing away from the substrate, the microlens being configured to steer incident radiation onto the photodetector;
   providing a carrier-free optical interference filter which has, at least on a first side facing away from the photodetector, a plane surface;
   arranging the optical interference filter such that the microlens is arranged between the photodetector and the interference filter;
   applying a material layer to the first side of the dielectric and to at least a part of the microlens;
   planarizing the material layer to produce a plane material layer surface;
   arranging a filter support structure on the material layer surface; and
   arranging the interference filter on the filter support structure while maintaining the material layer.

9. The method of claim 8, wherein providing and arranging the interference filter is implemented under application of a chemical vapor deposition.

10. The method of claim 9, wherein the interference filter is deposited in a sequence of five to fifty layers.

11. The method of claim 8, wherein at least the plane surface of the interference filter is arranged parallel to the first side of the dielectric.

12. The method of claim 8, wherein the interference filter is in direct contact with at least the plane of the microlens surface.

13. The method of claim 8, further comprising:
   applying a coating that covers the microlens,
   wherein the interference filter is arranged on a side of the coating facing away from the dielectric.

14. The method of claim 8, wherein the microlens has a mean diameter in a range of 0.5 µm to 50 µm.

15. A method, comprising:
   providing a substrate with a photodetector, a dielectric arranged on the substrate and a microlens arranged on a first side of the dielectric facing away from the substrate, the microlens being configured to steer incident radiation onto the photodetector;
   providing a carrier-free optical interference filter which has, at least on a first side facing away from the photodetector, a plane surface; and
   arranging the optical interference filter such that the microlens is arranged between the photodetector and the interference filter;
   applying a sacrificial layer to the first side of the dielectric and to at least a part of the microlens;
   planarizing the sacrificial layer to produce a plane sacrificial layer surface, wherein the microlens has a portion that is not covered by the sacrificial layer;
   arranging a filter support structure on the sacrificial layer surface and the uncovered portion of the microlens;
   arranging the interference filter on the filter support structure; and
   at least partly removing the sacrificial layer.

16. The method of claim 15, wherein providing and arranging the interference filter is implemented under application of a chemical vapor deposition.

17. The method of claim 16, wherein the interference filter is deposited in a sequence of five to fifty layers.

18. The method of claim 15, wherein at least the plane surface of the interference filter is arranged parallel to the first side of the dielectric.

19. The method of claim 15, wherein the interference filter is in direct contact with at least the plane of the microlens surface.

20. The method of claim 15, further comprising:
   applying a coating that covers the microlens,
   wherein the interference filter is arranged on a side of the coating facing away from the dielectric.

21. The method of claim 15, wherein the microlens has a mean diameter in a range of 0.5 µm to 50 µm.

* * * * *